United States Patent
Shin et al.

(10) Patent No.: US 10,976,869 B2
(45) Date of Patent: Apr. 13, 2021

(54) DISPLAY DEVICE

(71) Applicant: LG Display Co., Ltd., Seoul (KR)

(72) Inventors: SeungHwan Shin, Jeonju-si (KR); Joon Heo, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 1 day.

(21) Appl. No.: 16/519,137

(22) Filed: Jul. 23, 2019

(65) Prior Publication Data
US 2020/0033994 A1 Jan. 30, 2020

(30) Foreign Application Priority Data
Jul. 24, 2018 (KR) .......................... 10-2018-0085839

(51) Int. Cl.
| | |
|---|---|
| *G06F 3/042* | (2006.01) |
| *G02F 1/1333* | (2006.01) |
| *G02F 1/1368* | (2006.01) |
| *H01L 27/144* | (2006.01) |
| *G06F 3/041* | (2006.01) |
| *G02F 1/1343* | (2006.01) |
| *G02F 1/1362* | (2006.01) |

(52) U.S. Cl.
CPC .......... *G06F 3/0421* (2013.01); *G02F 1/1368* (2013.01); *G02F 1/13338* (2013.01); *G02F 1/134309* (2013.01); *G06F 3/0412* (2013.01); *G06F 3/0418* (2013.01); *H01L 27/1443* (2013.01); *G02F 2001/136222* (2013.01); *G02F 2201/121* (2013.01); *G02F 2201/123* (2013.01)

(58) Field of Classification Search
CPC .......... G02F 1/13318; G02F 1/134309; G02F 1/1368; G02F 3/0412; G02F 3/0418; G02F 3/04182; G02F 3/042; G02F 3/0421; G02F 2001/136222; G02F 2201/121; G02F 2201/123; H01L 27/1443
USPC .......................................................... 345/175
See application file for complete search history.

(56) References Cited

U.S. PATENT DOCUMENTS

| | | | | |
|---|---|---|---|---|
| 5,247,289 | A * | 9/1993 | Matsueda | G02F 1/136213 345/98 |
| 2008/0198143 | A1* | 8/2008 | Kinoshita | G06F 3/0412 345/175 |
| 2010/0156847 | A1* | 6/2010 | No | G06F 3/04164 345/175 |

(Continued)

FOREIGN PATENT DOCUMENTS

| | | |
|---|---|---|
| KR | 10-2010-0037311 A | 4/2010 |
| KR | 10-1285647 B1 | 7/2013 |

*Primary Examiner* — Mark Edwards
(74) *Attorney, Agent, or Firm* — Polsinelli PC

(57) ABSTRACT

A display device comprises a plurality of gate lines disposed in a first direction; a plurality of data lines disposed in a second direction different from the first direction and defining a plurality of pixels with the plurality of gate lines; a sensor pixel part including the plurality of pixels; a photo touch sensor disposed in the sensor pixel part; a first read-out line transferring a touch sensing signal of the photo touch sensor and a second read-out line configured to detect a noise, the first and second read-out lines disposed between the data lines in the second direction; a sensing data line disposed in the second direction and applying a sensor data signal to the photo touch sensor; and a sensing display gate line disposed in the first direction and applying a sensor gate signal to the photo touch sensor.

17 Claims, 7 Drawing Sheets

(56) References Cited

U.S. PATENT DOCUMENTS

| | | | |
|---|---|---|---|
| 2013/0176233 A1* | 7/2013 | Lin | G06F 3/04184 345/173 |
| 2014/0015801 A1* | 1/2014 | Chung | G06F 3/042 345/175 |
| 2017/0125506 A1* | 5/2017 | Kim | H01L 27/3265 |

* cited by examiner

DISPLAY DEVICE

CROSS-REFERENCE TO RELATED APPLICATION

This application claims the priority of Korean Patent Application No. 10-2018-0085839 filed on Jul. 24, 2018, in the Korean Intellectual Property Office, which is incorporated by reference in its entirety.

BACKGROUND

Field of the Disclosure

The present disclosure relates to a display device, and more particularly, to a display device in which a photo touch sensor is disposed.

Description of the Background

As the advent of information society, a display field which visually represents an electrical information signal is rapidly being developed. In accordance with the rapid development, various display devices having excellent performance such as thin thickness, light weight, and low power consumption properties have been developed.

Examples of the above-mentioned display devices may include a liquid crystal display device (LCD), an organic light emitting display device (OLED), and the like.

In recent years, display devices have been breaking away from conventional input systems, such as a button, a keyboard and a mouse, and have usually adopted a touch screen which allows a user to intuitively and conveniently input information or commands.

The touch screen is one of input devices that is installed in a display device and enables a user to input predetermined information by applying a pressure to a touch sensor within the touch screen while viewing the display device.

The touch screen can be classified into add-on type, on-cell type, and in-cell type according to its structure. Particularly, touch screen in-cell type display devices are being widely used since they are suitable for display devices with thin thickness and improved durability.

As a touch sensor in a touch screen in-cell type display device, a photo touch sensor and a capacitive touch sensor are mainly used. The photo touch sensor can recognize a touch based on the intensity of light. The capacitive touch sensor can recognize a touch based on a variation of capacitance.

Particularly, the photo touch sensor recognizes a touch based on photo leakage current of a phototransistor generated from light incident upon or reflected from a touch body. In this case, the display and touch driving operations are performed simultaneously, instead of in a time-division manner. Thus, a ripple of a common voltage caused by transition of data signal is transferred to a read-out line and a noise is generated.

The intensity of the noise is proportional to a parasitic capacitance loaded on the read-out line. The parasitic capacitance increases exponentially with an increase in inch and resolution, which has caused a problem in sensing.

SUMMARY

The present disclosure is to provide a photo sensor type display device in which sensing and display are performed simultaneously and the effect of a noise caused by transition of data signal is minimized.

The present disclosure is not limited to the above-mentioned aspects, which are not mentioned above, can be clearly understood by those skilled in the art from the following descriptions.

According to an aspect of the present disclosure, a display device is provided. The display device includes a plurality of gate lines placed in a first direction and a plurality of data lines placed in a second direction different from the first direction and defining a plurality of pixels together with the plurality of gate lines. The display device further includes a sensor pixel part including the plurality of pixels and a photo touch sensor placed in the sensor pixel part. The display device also includes a first read-out line transferring a touch sensing signal of the photo touch sensor and a second read-out line configured to detect a noise. The first read-out line and the second read-out line are placed between the data lines in the second direction. The display device further includes a sensing data line placed in the second direction and applying a sensor data signal to the photo touch sensor. The display device also includes a sensing display gate line placed in the first direction and applying a sensor gate signal to the photo touch sensor.

Other detailed matters of the exemplary aspects are included in the detailed description and the drawings.

According to the present disclosure, a display panel is driven by applying a photo sensor without using a time-division driving method, which is advantageous in securing charging characteristics. Also, a touch circuit has a simple structure, which is advantageous in reducing cost.

In a photo sensor type display device according to the present disclosure, the effect of a noise caused by transition of data signal is minimized, which is advantageous for an increase in inch and resolution. Further, the photo sensor type display device according to the present disclosure can be applied to a double rate driving (DRD) structure, and, thus, a decrease in transmittance can be minimized.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
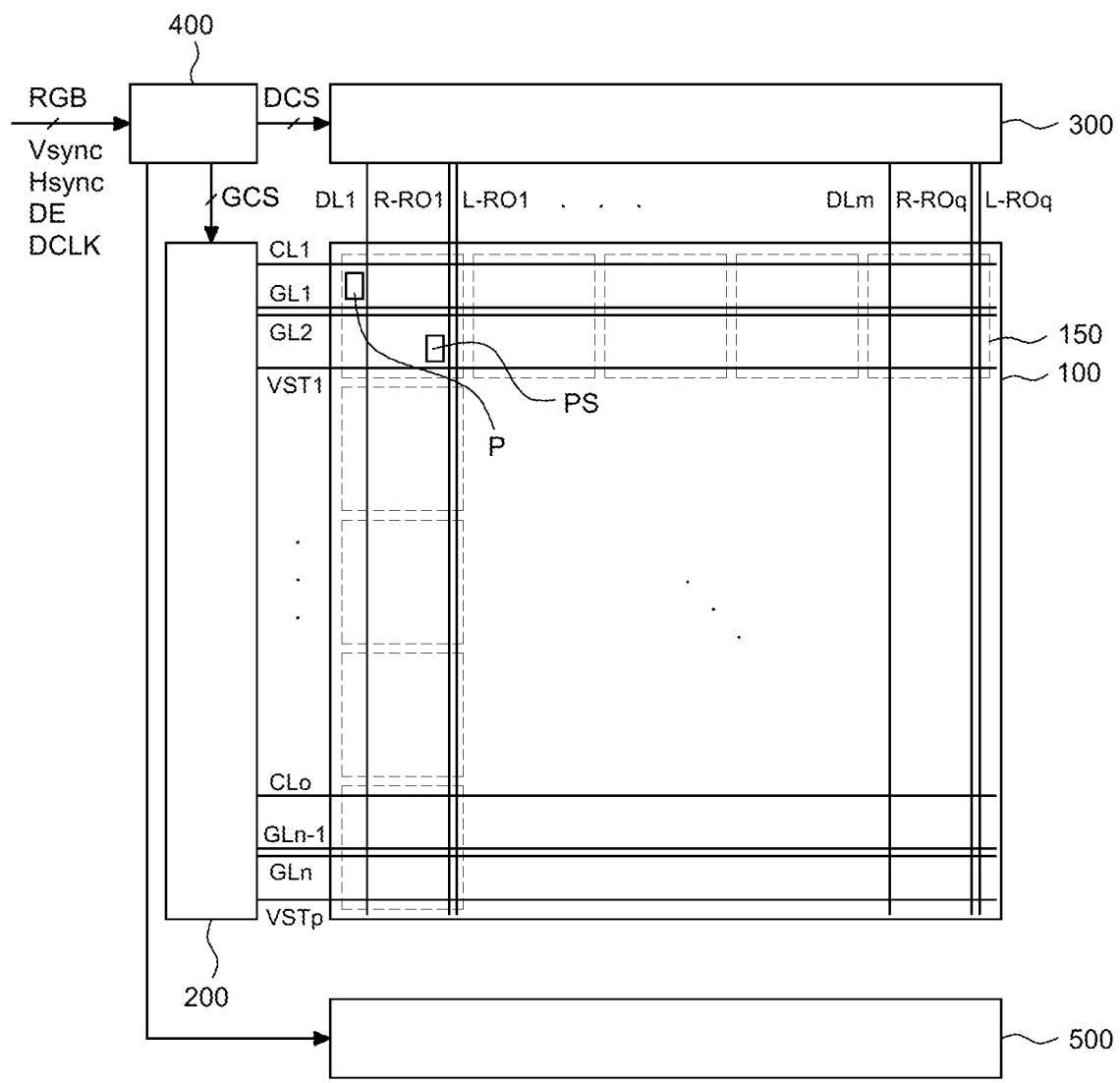
FIG. 1 is a block diagram illustrating an example of a display device according to an aspect of the present disclosure.

Advantages and characteristics of the present disclosure and a method of achieving the advantages and characteristics will be clear by referring to exemplary aspects described below in detail together with the accompanying drawings. However, the present disclosure is not limited to the exemplary aspects disclosed herein but will be implemented in various forms. The exemplary aspects are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary aspects of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various aspects of the present disclosure can be partially or entirely adhered to or combined with each other and can be interlocked and operated in technically various ways, and the aspects can be carried out independently of or in association with each other.

Hereafter, various aspects of the present disclosure will be described in detail with reference to the accompanying drawings.

FIG. 1 is a block diagram illustrating an example of a display device according to an aspect of the present disclosure.

Referring to FIG. 1, the display device according to an aspect of the present disclosure may include a display panel 100, a gate drive circuit 200, a data drive circuit 300, a timing controller 400, and a touch drive circuit 500.

The display panel 100 includes gate lines GL1, GL2, . . . , GLn−1, GLn and common lines CL1, . . . , CLo disposed in a first direction, and data lines DL1, . . . , DLm disposed in a second direction different from the first direction.

Further, in the display panel 100, pairs of read-out lines R-RO1, L-RO1, . . . , R-ROq, L-ROq may be disposed in the second direction between the data lines DL1, . . . , DLm. Furthermore, sensing storage lines VST1, . . . , VSTp may be disposed in the first direction between the gate lines GL1, GL2, . . . , GLn−1, GLn.

For example, a plurality of pixels P may be defined by intersection between the plurality of gate lines GL1, GL2, . . . , GLn−1, GLn and the plurality of data lines DL1, . . . , DLm.

The plurality of pixels P is electrically connected to the gate lines GL1, GL2, . . . , GLn−1, GLn, the data lines DL1, . . . , DLm, and the common lines CL1, . . . , CLo. Further, the plurality of pixels P may display images in response to pixel driving signals or pixel driving voltages applied through the gate lines GL1, GL2, . . . , GLn−1, GLn, the data lines DL1, . . . , DLm, and the common lines CL1, . . . , CLo.

The display panel 100 according to an aspect of the present disclosure may have a double rate driving (DRD) structure in which a pair of pixels P adjacent to each other is commonly connected to a single data line DL1, . . . , DLm. However, the present disclosure is not limited thereto. In the DRD structure, the number of gate lines is doubled while the number of data lines is halved, compared to a typical display panel, and, thus, the number of data integrated circuits (IC) decreases and a resolution is maintained.

As such, the display panel 100 according to an aspect of the present disclosure has the DRD structure. Thus, a sensing data lines can be disposed where a data line has been disposed and a photo touch sensor PS can be disposed where two gate lines are disposed adjacent to each other. Therefore, the photo touch sensor PS can be provided to sense a touch without a decrease in aperture ratio, compared to a typical display device.

The display panel 100 may include the plurality of pixels P and display images based on gray levels of the respective pixels P. Each of the plurality of pixels P may include a pixel electrode which is driven by a signal applied through a gate line GL1, GL2, . . . , GLn−1, GLn and a data line DL1, . . . , DLm and a common electrode which is driven by a common line CL1, . . . , CLo. Each of the plurality of pixels P may display an image when liquid crystal is tilted due to a difference in voltage between the pixel electrode and the common electrode.

The plurality of pixels P illustrated in FIG. 1 may be sub-pixels that display different colors from each other. A plurality of sub-pixels may form a pixel. For example, the sub-pixels may display red, green, and blue or red, green, blue, and white colors.

In the display panel 100, a plurality of sensor pixel part 150 may be defined.

Each sensor pixel part 150 may include a plurality of pixels.

The sensor pixel part 150 may include the photo touch sensor PS that recognizes a touch based on a change in the off-current of a sensor thin film transistor that changes depending on the intensity of light. More specifically, the photo touch sensor PS includes a sensor thin film transistor and a sensor storage capacitor, and the sensor thin film transistor is turned on depending on the intensity of light and the sensor storage capacitor is charged with voltage. Then, the charged voltage is output to the read-out line R-RO1, L-RO1, . . . , R-ROq, L-ROq at a predetermined timing, and, thus, a touch can be recognized. The structure of the plurality of sensor pixel parts 150 will be described in more detail with reference to the following drawings.

The gate drive circuit 200 may sequentially supply gate signals to the gate lines GL1, GL2, . . . GLn−1, GLn of the display panel 100 in response to a gate driving control signal GCS transmitted from the timing controller 400. The gate drive circuit 200 may include a shift register and a level shifter.

The gate drive circuit 200 may be disposed independently of the display panel 100. Otherwise, the gate drive circuit 200 may be embedded as a thin film by a gate-in-panel (GIP) method on an inactive area of the display panel 100 where pixels P are not disposed during the manufacture of a substrate of the display panel 100.

The data drive circuit 300 may generate a sampling signal using a data driving control signal DCS transmitted from the timing controller 400 and latch image data input from the timing controller 400 into a data signal according to the sampling signal. Then, the data drive circuit 300 may supply the data signal to the data lines DL1, . . . DLm in response to a source output enable (SOE) signal.

The data drive circuit 300 may be connected to a bonding pad of the display panel 100 by a chip-on-glass (COG) method or may be directly disposed on the display panel 100. In some cases, the data drive circuit 300 may be disposed to be integrated with the display panel 100. Otherwise, the data drive circuit 300 may be disposed by a chip-on-film (COF) method.

The timing controller 400 may transmit an input image signal RGB received from a host system (not illustrated) to the data drive circuit 300.

Further, the timing controller 400 may generate a timing control signal for controlling operation timing of the gate drive circuit 200 and the data drive circuit 300 using timing signals such as a clock signal DCLK, a horizontal synchronization signal Hsync, a vertical synchronization signal Vsync, and a data enable signal DE received together with the input image signal RGB. The timing controller 400 may generate a control signal GCS of the gate drive circuit 200 and a control signal DCS of the data drive circuit 300 in synchronization with the timing signals.

Furthermore, the timing controller 400 may generate a touch driving signal for driving the photo touch sensor PS and transmit the touch driving signal to the touch drive circuit 500. Moreover, the timing controller 400 may receive a touch sensing signal from the touch drive circuit 500 and produce touch information.

The touch drive circuit 500 may apply the touch driving signal transmitted from the timing controller 400 to the photo touch sensor PS. Then, the touch drive circuit 500 may receive a touch sensing signal transmitted from the photo touch sensor PS and determine a touch or non-touch based on the received touch sensing signal.

Figure 2:
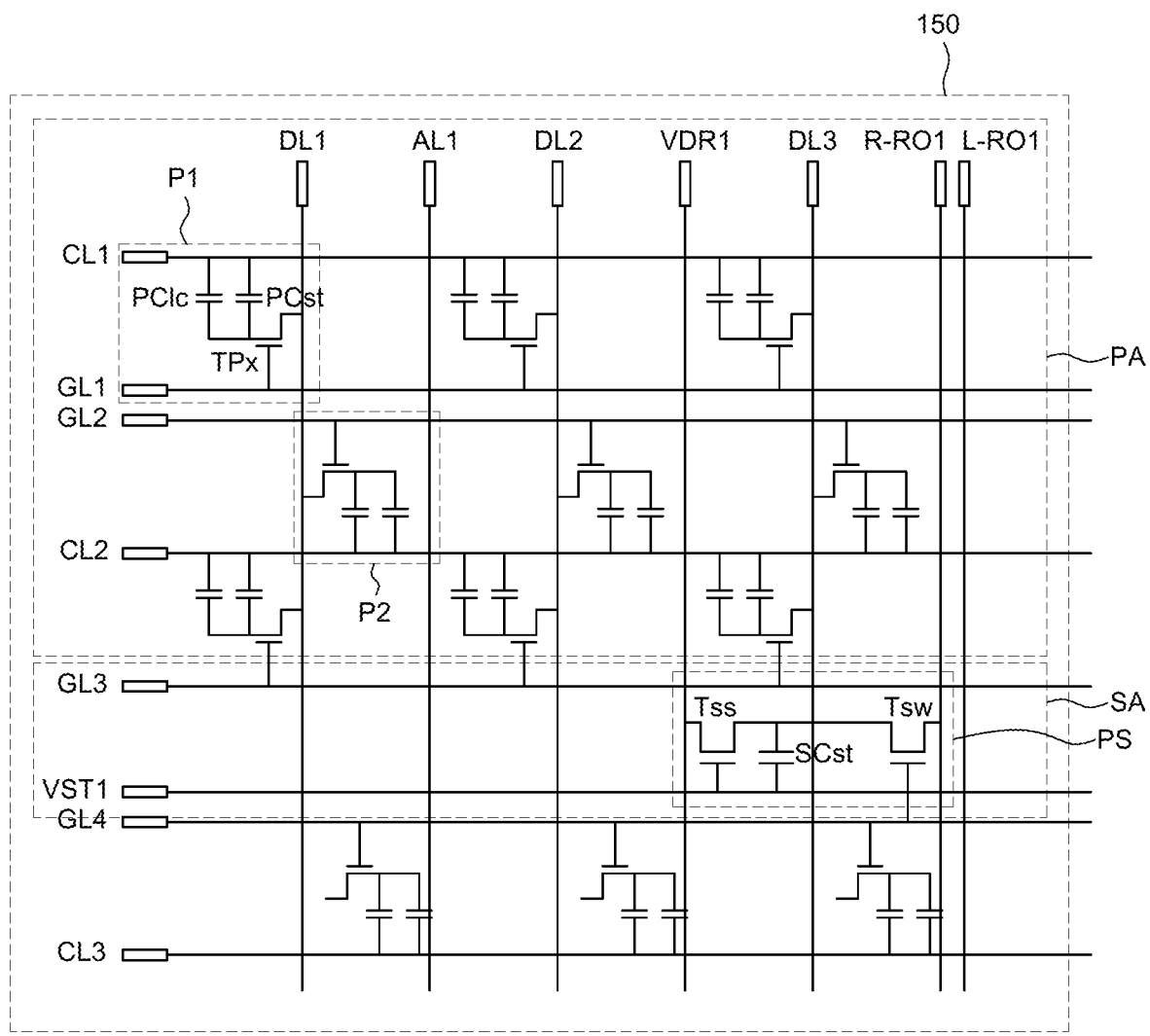
FIG. 2 is an equivalent circuit diagram showing an example of any one sensor pixel part placed in a display panel according to an aspect of the present disclosure.

FIG. 2 is an equivalent circuit diagram showing an example of any one sensor pixel part placed in a display panel according to an aspect of the present disclosure.

Figure 3:
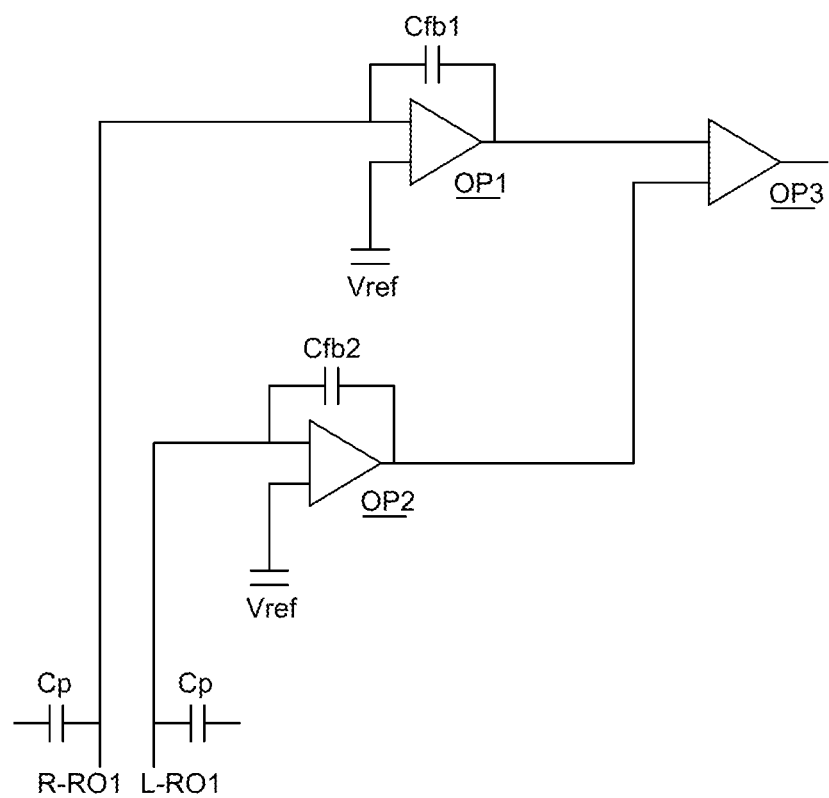
FIG. 3 is an equivalent circuit diagram showing an example of a read-out line and an operating amplifier according to an aspect of the present disclosure.

FIG. 3 is an equivalent circuit diagram showing an example of a read-out line and an operating amplifier according to an aspect of the present disclosure.

Figure 4:
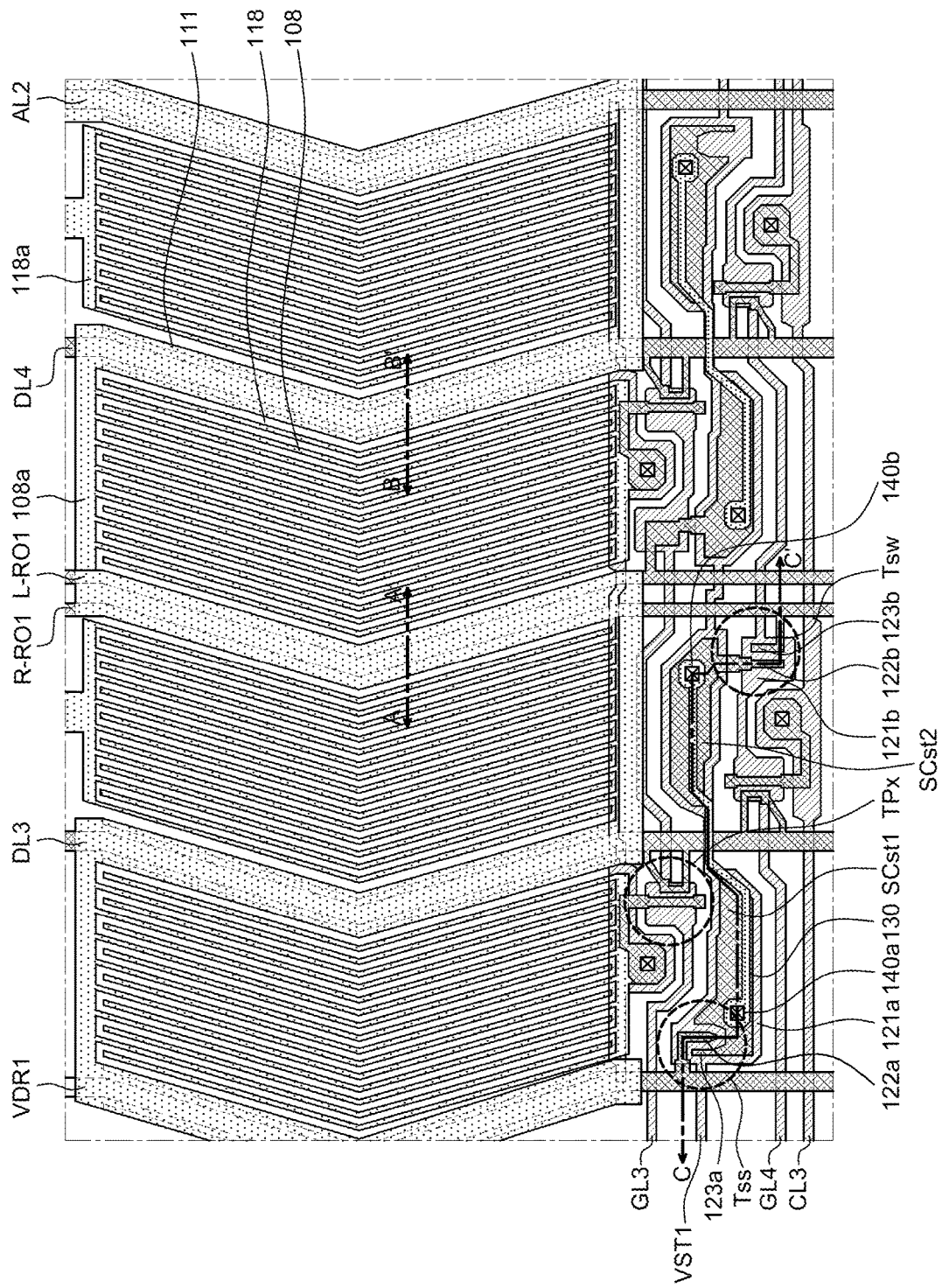
FIG. 4 is a plan view showing an aspect of a sensor pixel part.

FIG. 4 is a plan view showing an example of a sensor pixel part.

Referring to FIG. 2 first, the sensor pixel part 150 of the display panel according to an aspect of the present disclosure may include a pixel area PA where a plurality of pixels P1 and P2 is disposed and an image is displayed. Further, the sensor pixel part 150 may include a sensor area SA where at least one photo touch sensor PS is disposed and recognizes a touch by sensing light incident thereon.

The pixel area PA includes the plurality of pixels P1 and P2, and each of the plurality of pixels P1 and P2 may be a red, green, or blue sub-pixel.

The plurality of pixels P1 and P2 may be disposed in a DRD in a DRD structure. More specifically, adjacent pixels, e.g., a first pixel P1 and a second pixel P2, among the plurality of pixels P1 and P2 may be electrically connected to the same data line, e.g., a first data line DL1. Further, the first pixel P1 and the second pixel P2 may be electrically connected to different gate lines, e.g., a first gate line GL1 and a second gate line GL2.

The pixel area PA may include a first common line CL1 and a second common line CL2 disposed in the first direction and the first gate line GL1 and the second gate line GL2 disposed between the first common line CL1 and the second common line CL2. The pixel area PA may further include first to third data lines DL1 to DL3 disposed in the second direction different from the first direction. Furthermore, the pixel area PA may include an auxiliary line AL1 disposed in the second direction and disposed between the first data line DL1 and the second data line DL2 and a sensing data line VDR1 disposed between the second data line DL2 and the third data line DL3. The pixel area PA may also include first and second read-out lines R-RO1 and L-RO1 disposed adjacent to the third data line DL3.

The lines disposed in the second direction may be extended to the sensor area SA. The sensing data line VDR1 is configured to transfer a sensor data signal, i.e., a photo touch sensor driving signal, to the photo touch sensor PS disposed in the sensor area SA.

Each of the plurality of pixels P1 and P2 may include a pixel thin film transistor TPx, and a pixel capacitor PClc and a pixel storage capacitor PCst which are connected in parallel to the pixel thin film transistor TPx.

Although not illustrated in the drawings, each of the pixels P1 and P2 may include a pixel electrode connected to the pixel thin film transistor TPx and a common electrode that supplies a common voltage. Further, each of the pixels P1 and P2 may include a liquid crystal layer in which liquid crystals to be tilted by a vertical or horizontal electric field caused by the pixel electrode and the common electrode are disposed.

Referring to FIG. 2, the pixel thin film transistor TPx may store, in the pixel capacitor PClc and the pixel storage capacitor PCst, data signals applied from the data lines DL1, DL2, and DL3 in response to gate signals applied from gate lines GL1, GL2, GL3, and GL4.

The liquid crystals are driven according to the data signals stored in the pixel capacitor PClc, and the pixel storage capacitor PCst may stably maintain the data signals stored in the pixel capacitor PClc.

FIG. 2 illustrates an example where the display panel 100 according to an aspect of the present disclosure is a liquid crystal panel. However, the present disclosure is not limited thereto. For example, the display panel 100 according to an aspect of the present disclosure may be an organic light-emitting display panel. The organic light-emitting display panel may include an anode connected to a pixel thin film transistor TPx, an emission layer formed of an organic material, and a cathode.

As described above, in the photo sensor type display device in which sensing and display are performed simultaneously according to an aspect of the present disclosure, the first read-out line R-RO1 for sensing and the second read-out line L-RO1 for detecting a noise are disposed adjacent to each other.

The first and second read-out lines R-RO1 and L-RO1 are disposed in the second direction between data lines DL3 and DL4, and the first read-out line R-RO1 may transfer a touch sensing signal of the photo touch sensor PS. Further, the second read-out line L-RO1 may be disposed adjacent to the first read-out line R-RO1 to detect a noise.

Referring to FIG. 3, output voltages are detected by first and second operating amplifiers OP1 and OP2 connected to the first and second read-out lines R-RO1 and L-RO1, respectively. The detected output voltages are compared by a third operating amplifier OP3 to remove a noise value. Thus, the effect of a noise caused by transition of data signal can be minimized. For example, when an output voltage detected by the second operating amplifier OP2 is subtracted from an output voltage detected by the first operating amplifier OP1, a noise value which is common to the output voltages detected by the first and second operating amplifiers OP1 and OP2 is removed. Thus, it is possible to accurately detect a sensing voltage without the effect of a noise.

For reference, an operating amplifier is typically a high-gain amplifier for analog computer use. An analog computer requires an amplifier having a high gain, a high input impedance, and a low output impedance in order for its gain to be determined only by characteristics of passive elements used in a feedback circuit. The amplifier has been widely used as a standard IC of an analog amplifier. The operating amplifier as a standard IC is of differential input type and has a gain of 30 dB to 100 dB. By applying negative feedback thereto, an amplifying circuit with appropriate gain is obtained. An input/output characteristic of the circuit is determined as a ratio between an input impedance of the operating amplifier and an impedance of the feedback circuit.

The first, second, and third operating amplifiers OP1, OP2, and OP3 may be disposed in a touch control IC of the data drive circuit 300 or the touch drive circuit 500.

FIG. 3 illustrates parasitic capacitances Cp of the first and second read-out lines R-RO1 and L-RO1 that output predetermined voltages.

The touch control IC is configured to detect currents which are sensed by the first and second read-out lines R-RO1 and L-RO1 and amplified by the first and second operating amplifiers OP1 and OP2. A negative (−) input terminal of the touch control IC may be connected to the first and second read-out lines R-RO1 and L-RO1 and a reference voltage Vref may be applied to a positive (+) input terminal. Further, a voltage output from an output terminal is an amplified value of a sensed voltage. Herein, first and second feedback capacitors Cfb1 and Cfb2 may be provided between the negative (−) input terminal and the output terminal. However, the present disclosure is not limited thereto.

The first feedback capacitor Cfb1 and the second feedback capacitor Cfb2 may be set to the same value.

Conventionally, a ripple of a common voltage caused by transition of data signal may cause a voltage ripple of a read-out line due to a parasitic capacitance, and, thus, a noise may be generated. Therefore, the characteristics of a touch sensor are degraded and a voltage level margin for the touch sensor is decreased. That is, for example, if a noise has a greater value than a touch sensing signal, it is impossible to identify whether an output voltage detected by an operating amplifier is a noise value or a sensing voltage. Thus, the sensing accuracy is degraded.

To improve this situation, the first read-out line R-RO1 for sensing and the second read-out line L-RO1 for detecting a noise are disposed adjacent to each other according to the present disclosure. Further, the storage capacitor is shorted and connected to each of the first and second read-out lines R-RO1 and L-RO1 to match the parasitic capacitances Cp of the first and second read-out lines R-RO1 and L-RO1.

In this case, if there is no external sensing, voltages of the first operating amplifier OP1 connected to the first read-out line R-RO1 and the second operating amplifier OP2 connected to the second read-out line L-RO1 are compared by the third operating amplifier OP3 to remove a noise value. For example, when an output voltage (i.e., a noise value) detected by the second operating amplifier OP2 is subtracted from an output voltage (i.e., a noise value) detected by the first operating amplifier OP1, the result may be 0. This may be regarded as no external sensing.

If a sensing signal is generated, voltages of the first operating amplifier OP1 connected to the first read-out line R-RO1 and the second operating amplifier OP2 connected to the second read-out line L-RO1 are compared to remove a noise value. Thus, the sensing sensitivity can be increased, and a sensing voltage can be detected. For example, when an output voltage (i.e., a noise value) detected by the second operating amplifier OP2 is subtracted from an output voltage (i.e., a noise value+a sensing voltage) detected by the first operating amplifier OP1, the sensing voltage can be obtained. That is, the noise value which is common to the output voltages detected by the first and second operating amplifiers OP1 and OP2 is removed, and, thus, the sensing voltage can be detected accurately without the effect of a noise.

According to the present disclosure, the effect of a noise caused by transition of data signal is minimized, which is advantageous for an increase in inch and resolution.

Referring to FIG. 4, each pixel may include an open area where an image is displayed by a pixel electrode 118 and a common electrode 108. Further, each pixel may include a non-open area where an image is not displayed but driving elements, e.g., the pixel thin film transistor TPx, for driving the pixel electrode 118 and the common electrode 108 in the open area are disposed.

In the open area, the pixel electrode 118 and the common electrode 108 may be disposed.

The pixel electrode 118 forms an electric field together with the common electrode 108. Liquid crystal molecules in the liquid crystal layer are tilted by the electric field to display an image. A plurality of pixel electrodes 118 may be equally spaced apart in parallel to each other, and one ends of the plurality of pixel electrodes 118 may be connected to a pixel line 118a disposed in the first direction. The pixel electrodes 118 may be disposed in the open area and may also be disposed in the non-open area.

A plurality of common electrodes 108 may be equally spaced apart in parallel to each other, and one ends of the plurality of common electrodes 108 may be connected to a common line 108a disposed in the first direction. The common electrodes 108 may be disposed alternately with the pixel electrodes 118 in the open area.

Further, the common electrodes 108 may be disposed on the data lines DL3 and DL4, the sensing data line VDR1, the first and second read-out lines R-RO1 and L-RO1, and an auxiliary line AL2 to cover the data lines DL3 and DL4, the sensing data line VDR1, the first and second read-out lines R-RO1 and L-RO1, and the auxiliary line AL2.

Meanwhile, in the non-open area, a plurality of gate lines GL3 and GL4, a plurality of data lines DL3 and DL4, the auxiliary line AL2, the sensing data line VDR1, the first and second read-out lines R-RO1 and L-RO1, the pixel thin film transistor TPx, a sensing storage line VST1, a sensing gate line GL4, a sensor thin film transistor Tss, a sensor switch thin film transistor Tsw, and first and second sensor storage capacitors SCst1 and SCst2 may be disposed. Herein, the sensing gate line GL4 is configured with the existing gate line GL, but the present disclosure is not limited thereto. Another line may serve as the sensing gate line GL4. However, if another line serves as the sensing gate line GL4 instead of the existing gate line, the aperture ratio may be decreased. Therefore, in order to minimize a decrease in aperture ratio in the first direction of the display device, the sensing gate line GL4 may be configured with the existing gate line GL.

Herein, the sensing storage line VST1, the sensing gate line GL4, the sensor thin film transistor Tss, the sensor switch thin film transistor Tsw, and the first and second sensor storage capacitors SCst1 and SCst2 are disposed only in the sensor area SA. Details thereof will be described later. Herein, a shield line 111 for shieling light may be disposed on the auxiliary line AL2, the third and fourth data lines DL3 and DL4, and the sensing data line VDR1 disposed in the second direction to cover the lines. However, the present disclosure is not limited thereto. A shield line may also be disposed on the first and second read-out lines R-RO1 and L-RO1 to cover the first and second read-out lines R-RO1 and L-RO1.

The auxiliary line AL2, the sensing data line VDR1, and the first and second read-out lines R-RO1 and L-RO1 disposed in the second direction are not located in a separate region but located in a region where data lines are disposed in a typical display device (which does not have the DRD structure). Therefore, the display panel 100 according to an aspect of the present disclosure does not require a separate line region for the photo touch sensor PS. Accordingly, a decrease in aperture ratio can be minimized.

That is, in the display device 100 according to an aspect of the present disclosure, pixels are configured in the DRD structure. Thus, there is no need for a separate region for the auxiliary line AL2, the sensing data line VDR1, and the first and second read-out lines R-RO1 and L-RO1. Accordingly, a decrease in aperture ratio in the second direction can be minimized, compared to a case where a photo touch sensor is provided in a typical display device (which does not have the DRD structure).

The pixel thin film transistor TPx may include a third gate line GL3, a third data line DL3, a source electrode branched from the third data line DL3, and a drain electrode separated from the source electrode.

The sensing data line VDR1 may be disposed between the second data line and the third data line DL3 and connected to the sensor thin film transistor Tss to apply a sensor driving signal or sensor driving voltage to the sensor thin film transistor Tss. The sensor driving voltage applied to the sensor thin film transistor Tss may be applied from the touch drive circuit 500 or the timing controller 400.

The first read-out line R-RO1 may be electrically connected to the sensor switch thin film transistor Tsw of the photo touch sensor PS. Accordingly, the first read-out line R-RO1 may transfer a touch sensing signal of the photo touch sensor PS to the touch drive circuit 500. The first and second read-out lines R-RO1 and L-RO1 may be disposed to one-to-one correspond to the sensor pixel parts 150.

The sensor thin film transistor Tss may include a first gate electrode 121a, the sensing data line VDR1, a first source electrode 122a branched from the sensing data line VDR1, and a first drain electrode 123a separated from the first source electrode 122a.

The first drain electrode 123a may be extended in one direction to form the first sensor storage capacitor SCst1 together with the sensing storage line VST1 under the first drain electrode 123a.

The sensor switch thin film transistor Tsw may include a second gate electrode 121b, the first read-out line R-RO1, a second drain electrode 123b branched from the first read-out line R-RO1, and a second source electrode 122b separated from the second drain electrode 123b.

The second source electrode 122b may be extended in one direction to form the second sensor storage capacitor SCst2 together with the sensing storage line VST1 under the second source electrode 122b.

An upper part of the first sensor storage capacitor SCst1, i.e., the first drain electrode 123a, may be exposed to the outside through a first contact hole 140a. An upper part of the second sensor storage capacitor SCst2, i.e., the second source electrode 122b, may be exposed to the outside through a second contact hole 140b.

The first drain electrode 123a is electrically connected to a connection electrode 130 through the first contact hole 140a and the second source electrode 122b is electrically connected to the connection electrode 130 through the second contact hole 140b at the same time. Thus, the first drain electrode 123a and the second source electrode 122b may be connected to each other.

For example, referring to FIG. 1 through FIG. 4, the sensor pixel part 150 may include a first pixel P1 and a second pixel P2 adjacent to the first pixel P1. Herein, the first pixel P1 and the second pixel P2 are connected to the first data line DL1, and the first pixel P1 and the second pixel P2 may be connected to the first gate line GL1 and the second gate line GL2, respectively.

Further, the sensor pixel part 150 may further include a third pixel adjacent to the second pixel P2 and a fourth pixel adjacent to the third pixel. Herein, the third pixel and the fourth pixel may be connected to the second data line DL2 adjacent to the first data line DL1 and may further include the auxiliary lien AL1 disposed between the first data line DL1 and the second data line DL2.

Furthermore, the sensor pixel part 150 may further include a fifth pixel adjacent to the fourth pixel and a sixth pixel adjacent to the fifth pixel. Herein, the fifth pixel and the sixth pixel may be connected to the third data line DL3 adjacent to the second data line DL2, and the sensing data line VDR1 may be disposed between the second data line DL2 and the third data line DL3.

A sensor pixel part adjacent to the sensor pixel part 150 described above may further include a seventh pixel adjacent to the sixth pixel and an eighth pixel adjacent to the seventh pixel. Herein, the seventh pixel and the eighth pixel are connected to the fourth data line DL4 adjacent to the third data line DL3, and the first and second read-out lines R-RO1 and L-RO1 may be disposed between the third data line DL3 and the fourth data line DL4.

The sensor pixel part 150 may include the sensor thin film transistor Tss that is disposed in the fifth pixel and connected to the sensing data line VDR1 and generates an output signal in response to light. Further, the sensor pixel part 150 may include the first sensor storage capacitor SCst1 that stores the output signal output from the sensor thin film transistor Tss. The sensor pixel part 150 may also include the second sensor storage capacitor SCst2 that is disposed in the sixth pixel and connected to the first sensor storage capacitor SCst1. Further, the sensor pixel part 150 may include the sensor switch thin film transistor Tsw that outputs an output signal stored in the first and second sensor storage capacitors SCst1 and SCst2 to the first read-out line R-RO1 in response to a sensor gate signal.

The sensor pixel part adjacent to the sensor pixel part 150 may further include first and second auxiliary storage capacitors that are disposed in the seventh and eighth pixels and have storage capacitances corresponding to the first and sensor storage capacitors SCst1 and SCst2.

The seventh and eighth pixels are mirror-symmetric to the fifth and sixth pixels around the first and second read-out lines R-RO1 and L-RO1. Further, the seventh and eighth pixels may have substantially the same configuration as the fifth and sixth pixels except the sensor thin film transistor Tss and the sensor switch thin film transistor Tsw.

The cross-sectional structure of the open area of the display device will be described in more detail.

Figure 5:
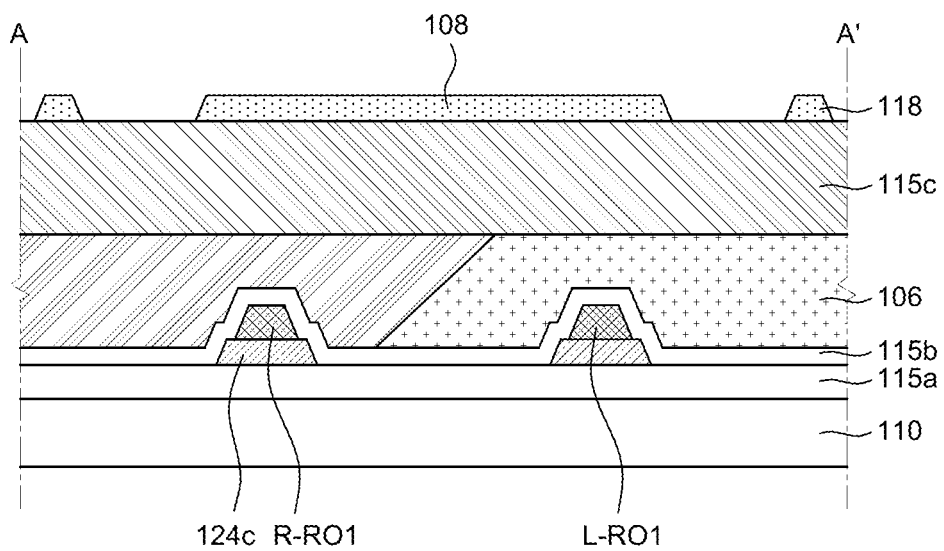
FIG. 5 is a cross-sectional view as taken along line A-A' of the sensor pixel part illustrated in FIG. 4.

FIG. 5 is a cross-sectional view as taken along line A-A' of the sensor pixel part illustrated in FIG. 4.

Figure 6:
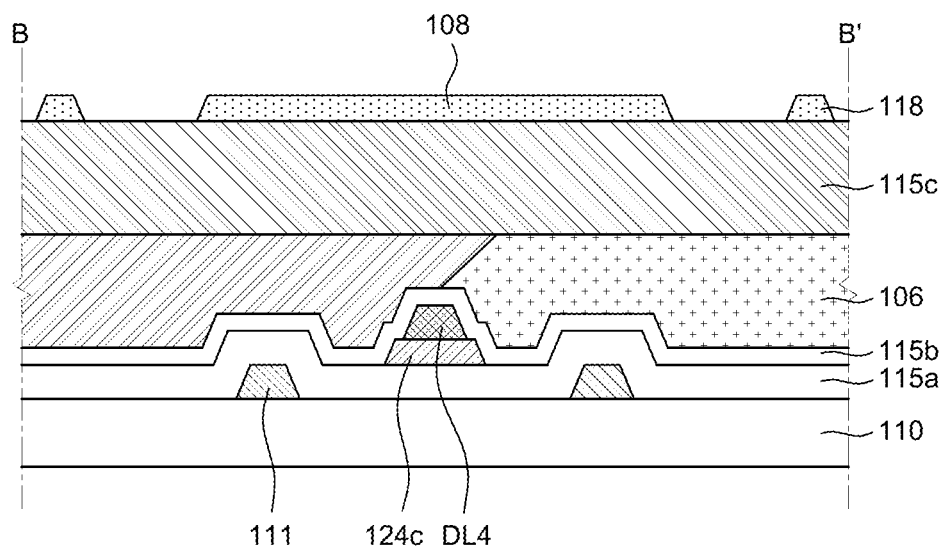
FIG. 6 is a cross-sectional view as taken along line B-B' of the sensor pixel part illustrated in FIG. 4.

FIG. 6 is a cross-sectional view as taken along line B-B' of the sensor pixel part illustrated in FIG. 4. FIG. 5 and FIG. 6 show examples of a part of the cross-section of the open area of the sensor pixel part.

Referring to FIG. 5 and FIG. 6, the shield line 111 may be disposed on a substrate 110.

The shield line 111 may be disposed to cover, e.g., the auxiliary line AL2, the third data line DL3, the fourth data line DL4, and the sensing data line VDR1. However, the present disclosure is not limited thereto.

For example, the shield line 111 may be formed of one of molybdenum (Mo), aluminum (Al), chromium (Cr), gold (Au), titanium (Ti), nickel (Ni), neodymium (Nd), and copper (Cu), or alloys thereof.

A gate insulating layer 115a may be disposed on the shield line 111. The gate insulating layer 115a may be formed of a silicon oxide layer (SiOx), a silicon nitride layer (SiNx), or a multilayer thereof.

A semiconductor layer 124c may be disposed on the gate insulating layer 115a.

The semiconductor layer 124c may be formed of any one of semiconductor materials such as amorphous silicon, polycrystalline silicon, low temperature polysilicon, and oxide semiconductor.

The auxiliary line AL2, the third data line DL3, the fourth data line DL4, the sensing data line VDR1, and the first and second read-out lines R-RO1 and L-RO1 may be disposed on the semiconductor layer 124c.

For example, the auxiliary line AL2, the third data line DL3, the fourth data line DL4, the sensing data line VDR1, and the first and second read-out lines R-RO1 and L-RO1 may be formed of one of molybdenum (Mo), aluminum (Al), chromium (Cr), gold (Au), titanium (Ti), nickel (Ni), neodymium (Nd), and copper (Cu), or alloys thereof.

An interlayer insulating layer 115b may be disposed on the auxiliary line AL2, the third data line DL3, the fourth data line DL4, the sensing data line VDR1, and the first and second read-out lines R-RO1 and L-RO1.

The interlayer insulating layer 115b serves to insulate the auxiliary line AL2, the third data line DL3, the fourth data line DL4, the sensing data line VDR1, and the first and second read-out lines R-RO1 and L-RO1 from the components of their upper layer. The interlayer insulating layer 115b may be formed as, e.g., a silicon oxide layer (SiOx), a silicon nitride layer (SiNx), or a multilayer thereof.

A color filter layer 106 including any one of red, green, and blue color filters or two or more laminated color filters may be disposed on the interlayer insulating layer 115b.

An overcoating layer 115c may be disposed on the color filter layer 106.

The overcoating layer 115c serves to flatten steps on the lower side. The overcoating layer 115c may be formed of an organic material such as photo acryl, polyimide, benzocyclobutene resin, acrylate resin, and the like.

The pixel electrode 118 and the common electrode 108 may be disposed on the overcoating layer 115c.

The pixel electrode 118 generates an electric field together with the common electrode 108. Liquid crystal molecules in the liquid crystal layer are tilted by the electric field to display an image. The plurality of pixel electrodes 118 may be equally spaced apart in parallel to each other, and one ends of the plurality of pixel electrodes 118 may be connected to the pixel line 118a disposed in the first direction. The pixel electrodes 118 may be disposed in the open area and may also be disposed in the non-open area.

The plurality of common electrodes 108 may be equally spaced apart in parallel to each other, and one ends of the plurality of common electrodes 108 may be connected to the common line 108a disposed in the first direction. The common electrodes 108 may be disposed alternately with the pixel electrodes 118 in the open area.

The common electrode 108 and the pixel electrode 118 may be formed as transparent conductive layers. The transparent conductive layers may be formed of a transparent conductive material such as indium tin oxide (ITO) and indium zinc oxide (IZO). FIG. 4 and FIG. 5 illustrate that the common electrode 108 and the pixel electrode 118 are disposed on the same layer, but the present disclosure is not limited thereto. The common electrode 108 and the pixel electrode 118 may be formed on different layers from each other. In this case, for example, if the common electrode 108 is placed on the overcoating layer 115c, a second insulating layer may be disposed on the common electrode 108 and the pixel electrode 118 may be disposed on the second insulating layer.

Hereafter, the sensor area SA will be described in more detail.

Referring to FIG. 2 through FIG. 4 again, in the sensor area SA according to an aspect of the present disclosure, the third gate GL3, the sensing storage line VST1, and a sensing display gate line GL4 are disposed in the first direction. Further, the sensing data line VDR1 and the first and second read-out lines R-RO1 and L-RO1 are disposed in the second direction different from the first direction.

The sensing storage line VST1 is disposed since the sensor storage capacitor SCst is disposed.

The sensing display gate line GL4 transfers a gate signal to the pixels disposed in the pixel area PA and transfers a sensor gate signal to the photo touch sensor PS disposed in the sensor area SA at the same time. That is, the sensing display gate line GL4 is disposed by combining an existing sensing gate line with the fourth gate line. Therefore, the sensor area SA of the display panel according to an aspect of the present disclosure has a reduced area. Thus, a decrease in aperture ratio caused by the presence of the photo touch sensor PS can be minimized. However, the present disclosure is not limited thereto.

As described above, the photo touch sensor PS according to an aspect of the present disclosure may include the sensor thin film transistor Tss, the sensor storage capacitor SCst, and the sensor switch thin film transistor Tsw.

The sensor thin film transistor Tss may generate photo leakage current in response to the intensity of incident light or reflected light and store the photo leakage current in the sensor storage capacitor SCst.

The first gate electrode 121a of the sensor thin film transistor Tss may be connected to the sensing storage line VST1 and the first source electrode 122a may be connected to the sensing data line VDR1. Further, the first drain electrode 123a may be connected to the first sensor storage capacitor SCst1.

The first sensor storage capacitor SCst1 may store an output signal of the sensor thin film transistor Tss.

Further, the sensor switch thin film transistor Tsw may output a touch sensing signal stored in the first and second sensor storage capacitors SCst1 and SCst2 to the first read-out line R-RO1 in response to a sensor gate signal applied from the sensing display gate line GL4.

The second gate electrode 121b of the sensor switch thin film transistor Tsw may be connected to the sensing display gate line GL4. Further, the second source electrode 122b and the second drain electrode 123b may be connected to the second sensor storage capacitor SCst2 and the first read-out line R-RO1, respectively.

The cross-sectional structure of the non-open area will be described in more detail.

Figure 7:
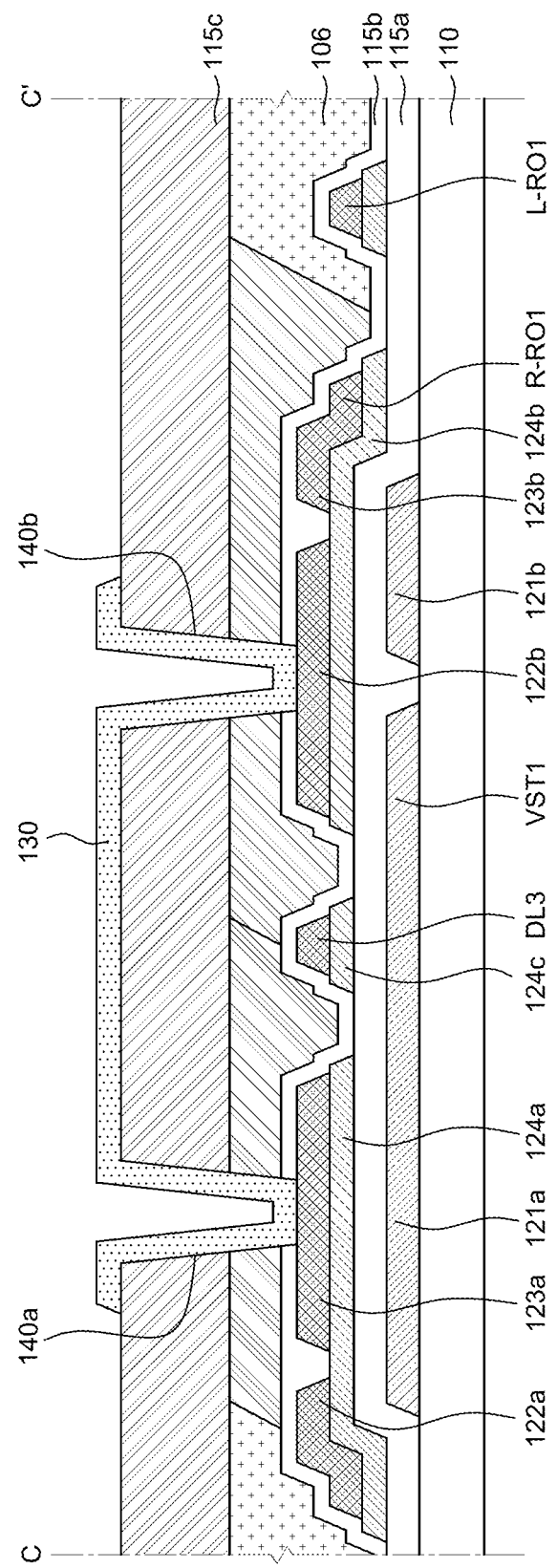
FIG. 7 is a cross-sectional view as taken along line C-C' of the sensor pixel part illustrated in FIG. 4.

FIG. 7 is a cross-sectional view as taken along line C-C' of the sensor pixel part illustrated in FIG. 4. FIG. 7 shows an example of a part of the cross-section of the non-open area of the sensor pixel part.

Referring to FIG. 7, the first gate electrode 121a, the second gate electrode 121b, and the sensing storage line VST1 may be disposed on the substrate 110.

In this case, the first gate electrode 121a and the second gate electrode 121b may be formed as a part of the sensing storage line VST1.

The first gate electrode 121a, the second gate electrode 121b, and the sensing storage line VST1 may be formed of the same metal material. For example, they may be formed of any one selected from the group consisting of molybdenum (Mo), aluminum (Al), chromium (Cr), gold (Au), titanium (Ti), nickel (Ni), neodymium (Nd), and copper (Cu), or alloys thereof.

The gate insulating layer 115a may be disposed on the first gate electrode 121a, the second gate electrode 121b, and the sensing storage line VST1. The gate insulating layer 115a may be formed as, e.g., a silicon oxide layer (SiOx), a silicon nitride layer (SiNx), or a multilayer thereof.

A first active layer 124a, a second active layer 124b, and a semiconductor layer 124c may be disposed on the gate insulating layer 115a.

The first active layer 124a, the second active layer 124b, and the semiconductor layer 124c may be formed of any one of semiconductor materials such as amorphous silicon, polycrystalline silicon, low temperature polysilicon, and oxide semiconductor.

On the first and second active layers 124a and 124b, the first source electrode 122a branched from the sensing data line VDR1, the first drain electrode 123a separated from the first source electrode 122a, the second source electrode 122b, and the second drain electrode 123b branched from the first read-out line R-RO1 may be disposed.

Further, on the semiconductor layer 124c, the data line DL3 and the first and second read-out lines R-RO1 and L-RO1 may be disposed.

The first read-out line R-RO1 and the second read-out line L-RO1 may be disposed adjacent to each other with a predetermined distance therebetween.

In this case, the first gate electrode 121a, the first source electrode 122a, the first drain electrode 123a, and the first active layer 124a may form the sensor thin film transistor Tss. That is, the first source electrode 122a may serve as a first electrode of the sensor thin film transistor Tss and the first drain electrode 123a may serve as a second electrode of the sensor thin film transistor Tss.

Further, the second gate electrode 121b, the second source electrode 122b, the second drain electrode 123b, and the second active layer 124b may form the sensor switch thin film transistor Tsw. In this case, the second source electrode 122b may serve as a second electrode of the sensor switch thin film transistor Tsw and the second drain electrode 123b may serve as a first electrode of the sensor switch thin film transistor Tsw. Furthermore, the second drain electrode 123b may also serve as the first read-out line R-RO1.

For example, the first source electrode 122a, the first drain electrode 123a, the second source electrode 122b, and the second drain electrode 123b may be formed of one of molybdenum (Mo), aluminum (Al), chromium (Cr), gold (Au), titanium (Ti), nickel (Ni), neodymium (Nd), and copper (Cu), or alloys thereof.

As described above, the first drain electrode 123a may be extended in one direction to form the first sensor storage capacitor SCst1 together with the sensing storage line VST1 under the first drain electrode 123a.

Further, the second drain electrode 123b may be extended in one direction to form the second storage capacitor SCst2 together with the sensing storage line VST1 under the second drain electrode 123b.

The interlayer insulating layer 115b may be disposed on the first source electrode 122a, the first drain electrode 123a, the second source electrode 122b, the second drain electrode 123b, the data line DL3, and the first and second read-out lines R-RO1 and L-RO1.

In this case, the interlayer insulating layer 115b serves to insulate the first source electrode 122a, the first drain electrode 123a, the second source electrode 122b, the second drain electrode 123b, the data line DL3, and the first and second read-out lines R-RO1 and L-RO1 from the components of their upper layer. The interlayer insulating layer 115b may be formed of a silicon oxide layer (SiOx), a silicon nitride layer (SiNx), or a multilayer thereof.

the color filter layer 106 including any one of red, green, and blue color filters or two or more laminated color filters may be disposed on the interlayer insulating layer 115b.

The overcoating layer 115c may be disposed on the color filter layer 106.

The overcoating layer 115c serves to flatten steps on the lower side. The overcoating layer 115c may be formed of an organic material such as photo acryl, polyimide, benzocyclobutene resin, acrylate resin, and the like.

The pixel electrode 118 and the common electrode 108 may be disposed on the overcoating layer 115c.

Further, the connection electrode 130 may be disposed on the overcoating layer 115c.

An upper part of the first sensor storage capacitor SCst1, i.e., the first drain electrode 123a, may be exposed to the outside through the first contact hole 140a. An upper part of the second sensor storage capacitor SCst2, i.e., the second drain electrode 123b, may be exposed to the outside through the second contact hole 140b.

The first drain electrode 123a is electrically connected to the connection electrode 130 through the first contact hole 140a and the second drain electrode 123b is electrically connected to the connection electrode 130 through the second contact hole 140b at the same time. Thus, the first drain electrode 123a and the second drain electrode 123b may be connected to each other.

The common electrode 108 and the pixel electrode 118 may be formed as transparent conductive layers. The transparent conductive layers may be formed of a transparent conductive material such as indium tin oxide (ITO) or indium zinc oxide (IZO).

As described above, in the display device according to an aspect of the present disclosure, a line for transferring a sensor gate signal to the photo touch sensor PS and a gate line for applying a gate signal to a corresponding pixel are combined and disposed. Therefore, despite the presence of the photo touch sensor PS, a decrease in aperture ratio can be minimized. However, the present disclosure is not limited thereto.

The exemplary aspects of the present disclosure can also be described as follows:

According to an aspect of the present disclosure, there is provided a display device. The display device includes a plurality of gate lines placed in a first direction; a plurality of data lines placed in a second direction different from the first direction and defining a plurality of pixels together with the plurality of gate lines; a sensor pixel part including the plurality of pixels; a photo touch sensor placed in the sensor pixel part; a first read-out line transferring a touch sensing signal of the photo touch sensor and a second read-out line configured to detect a noise, which are placed between the data lines in the second direction; a sensing data line placed in the second direction and applying a sensor data signal to the photo touch sensor; and a sensing display gate line placed in the first direction and applying a sensor gate signal to the photo touch sensor.

The sensing display gate line may serve to apply the sensor gate signal to the photo touch sensor and apply a gate signal to the pixels.

The photo touch sensor may include a sensor thin film transistor connected to the sensing data line and generating an output signal in response to incident light or reflected light; a sensor storage capacitor storing the output signal output from the sensor thin film transistor; and a sensor switch thin film transistor outputting the output signal stored in the sensor storage capacitor to the first read-out line in response to the sensor gate signal.

The sensor pixel part may include a first pixel and a second pixel adjacent to the first pixel, and the first pixel and the second pixel may be connected to a first data line, and the first pixel and the second pixel may be connected to a first gate line and a second gate line, respectively.

The sensor pixel part further may include a third pixel adjacent to the second pixel and a fourth pixel adjacent to the third pixel, and the third pixel and the fourth pixel may be connected to a second data line adjacent to the first data line, and the sensor pixel part may further include an auxiliary line between the first data line and the second data line.

The sensor pixel part may further include a fifth pixel adjacent to the fourth pixel and a sixth pixel adjacent to the fifth pixel, and the fifth pixel and the sixth pixel may be connected to a third data line adjacent to the second data line, and the sensing data line may be placed between the second data line and the third data line.

The sensor pixel part may further include a seventh pixel adjacent to the sixth pixel and an eighth pixel adjacent to the seventh pixel, and the seventh pixel and the eighth pixel may be connected to a fourth data line adjacent to the third data line, and the first and second read-out lines may be placed between the third data line and the fourth data line.

The display device may further include a sensor thin film transistor connected to the sensing data line and generating an output signal in response to light and a first sensor storage capacitor storing the output signal output from the sensor thin film transistor, which are placed in the fifth pixel; and a second sensor storage capacitor connected to the first sensor storage capacitor and a sensor switch thin film transistor outputting the output signal stored in the first and second sensor storage capacitors to the first read-out line in response to the sensor gate signal, which are placed in the sixth pixel.

The display device may further include first and second auxiliary storage capacitors placed in the seventh and eighth pixels and having storage capacitances corresponding to the first and sensor storage capacitors.

The seventh and eighth pixels may be mirror-symmetric to the fifth and sixth pixels around the first and second read-out lines and have the same configuration as the fifth and sixth pixels except the sensor thin film transistor and the sensor switch thin film transistor.

The display device may further include an interlayer insulating layer placed on the sensor thin film transistor, the first and second sensor storage capacitors, and the sensor switch thin film transistor; a color filter layer placed on the interlayer insulating layer; and an overcoating layer placed on the color filter layer.

The display device may further include first and second contact holes prepared by removing a part of the interlayer insulating layer, the color filter layer, and the overcoating layer to expose upper parts of the first and second sensor storage capacitors, respectively.

The display device may further include a common electrode placed on the overcoating layer and connecting the first and second sensor storage capacitors through the first and second contact holes.

The display device may further include a first operating amplifier connected to the first read-out line; a second operating amplifier connected to the second read-out line; and a third operating amplifier comparing output voltages output from the first operating amplifier and the second operating amplifier.

If there is no external sensing, the third operating amplifier may subtract the output voltage of the second operating amplifier from the output voltage of the first operating amplifier to remove a noise value.

If the output voltage detected by the second operating amplifier is subtracted from the output voltage detected by the first operating amplifier and the result is 0, this may be regarded as no external sensing.

If an output voltage detected by the second operating amplifier is subtracted from an output voltage detected by the first operating amplifier and the result is not 0, this may be regarded as generation of a sensing signal.

If the sensing signal is generated, the output voltage of the second operating amplifier may be subtracted from the output voltage of the first operating amplifier to remove the noise value and detect a sensing voltage.

The sensor pixel parts may be placed to one-to-one correspond to the first and second read-out lines.

Although the exemplary aspects of the present disclosure have been described in detail with reference to the accompanying drawings, the present disclosure is not limited thereto and may be embodied in many different forms without departing from the technical concept of the present disclosure. Therefore, the exemplary aspects of the present disclosure are provided for illustrative purposes only but not intended to limit the technical concept of the present disclosure. The scope of the technical concept of the present disclosure is not limited thereto. Therefore, it should be understood that the above-described exemplary aspects are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A display device, comprising:
 a plurality of gate lines disposed in a first direction;
 a plurality of data lines disposed in a second direction different from the first direction and defining a plurality of pixels with the plurality of gate lines;
 a sensor pixel part including the plurality of pixels;
 a photo touch sensor disposed in the sensor pixel part;
 a first read-out line transferring a touch sensing signal of the photo touch sensor and a second read-out line configured to detect a noise, the first and second read-out lines disposed between the data lines in the second direction;
 a sensing data line disposed in the second direction and applying a sensor data signal to the photo touch sensor; and
 a sensing display gate line disposed in the first direction and applying a sensor gate signal to the photo touch sensor,
 wherein the sensor pixel part includes a first pixel and a second pixel adjacent to the first pixel, and the first pixel and the second pixel are connected to a first data line, and the first pixel and the second pixel are connected to a first gate line and a second gate line, respectively,
 wherein the sensor pixel part includes a third pixel adjacent to the second pixel and a fourth pixel adjacent to the third pixel, and the third pixel and the fourth pixel are connected to a second data line adjacent to the first data line, and
 wherein the sensor pixel part includes a fifth pixel adjacent to the fourth pixel and a sixth pixel adjacent to the fifth pixel, and the fifth pixel and the sixth pixel are connected to a third data line adjacent to the second data line, and the sensing data line is placed between the second data line and the third data line.

2. The display device according to claim 1, wherein the sensing display gate line serves to apply the sensor gate signal to the photo touch sensor and apply a gate signal to the plurality of pixels.

3. The display device according to claim 1, wherein the photo touch sensor includes:
 a sensor thin film transistor connected to the sensing data line and generating an output signal in response to incident light or reflected light;
 a sensor storage capacitor storing the output signal output from the sensor thin film transistor; and
 a sensor switch thin film transistor outputting the output signal stored in the sensor storage capacitor to the first read-out line in response to the sensor gate signal.

4. The display device according to claim 1, wherein the sensor pixel part further comprises an auxiliary line between the first data line and the second data line.

5. The display device according to claim 1, wherein the sensor pixel part further includes a seventh pixel adjacent to the sixth pixel and an eighth pixel adjacent to the seventh pixel, and the seventh pixel and the eighth pixel are connected to a fourth data line adjacent to the third data line, and the first and second read-out lines are placed between the third data line and the fourth data line.

6. The display device of claim 1, further comprising:
 a sensor thin film transistor connected to the sensing data line and generating an output signal in response to light and a first sensor storage capacitor storing the output signal output from the sensor thin film transistor, which are placed in the fifth pixel; and
 a second sensor storage capacitor connected to the first sensor storage capacitor and a sensor switch thin film transistor outputting the output signal stored in the first and second sensor storage capacitors to the first read-out line in response to the sensor gate signal, which are placed in the sixth pixel.

7. The display device according to claim 6, further comprising:
 first and second auxiliary storage capacitors placed in the seventh and eighth pixels and having storage capacitances corresponding to the first and sensor storage capacitors.

8. The display device according to claim 7, wherein the seventh and eighth pixels are mirror-symmetric to the fifth and sixth pixels around the first and second read-out lines and have the same configuration as the fifth and sixth pixels except the sensor thin film transistor and the sensor switch thin film transistor.

9. The display device according to claim 6, further comprising:
 an interlayer insulating layer placed on the sensor thin film transistor, the first and second sensor storage capacitors, and the sensor switch thin film transistor;
 a color filter layer placed on the interlayer insulating layer; and an overcoating layer placed on the color filter layer.

10. The display device according to claim 9, further comprising:
 first and second contact holes formed by removing a part of the interlayer insulating layer, the color filter layer, and the overcoating layer to expose upper parts of the first and second sensor storage capacitors, respectively.

11. The display device according to claim 10, further comprising:
 a common electrode placed on the overcoating layer and connecting the first and second sensor storage capacitors through the first and second contact holes.

12. The display device according to claim 1, further comprising:
 a first operating amplifier connected to the first read-out line;
 a second operating amplifier connected to the second read-out line; and a third operating amplifier comparing output voltages output from the first operating amplifier and the second operating amplifier.

13. The display device according to claim 12, wherein if there is no external sensing, the third operating amplifier subtracts the output voltage of the second operating amplifier from the output voltage of the first operating amplifier to remove a noise value.

14. The display device according to claim 12, wherein if the output voltage detected by the second operating amplifier is subtracted from the output voltage detected by the first operating amplifier and the result is 0, there is no external sensing.

15. The display device according to claim 12, wherein if an output voltage detected by the second operating amplifier is subtracted from an output voltage detected by the first operating amplifier and the result is not 0, this is regarded as generation of a sensing signal.

16. The display device according to claim 15, wherein the output voltage of the second operating amplifier is subtracted from the output voltage of the first operating amplifier to remove the noise value and detect a sensing voltage if the sensing signal is generated.

17. The display device according to claim 1, wherein the sensor pixel parts are disposed to correspond to the first and second read-out lines.

* * * * *